(12) United States Patent
Meck et al.

(10) Patent No.: US 6,587,018 B1
(45) Date of Patent: Jul. 1, 2003

(54) NOTCH FILTER AND METHOD

(75) Inventors: Ronald A. Meck, Soquel, CA (US); Earl W. McCune, Jr., Santa Clara, CA (US); Edwin R. Twitchell, San Jose, CA (US)

(73) Assignee: Tropian, Inc., Cupertino, CA (US)

( * ) Notice: Subject to any disclaimer, the term of this patent is extended or adjusted under 35 U.S.C. 154(b) by 0 days.

(21) Appl. No.: 09/865,972

(22) Filed: May 25, 2001

(51) Int. Cl.⁷ .................................................. H03H 7/01
(52) U.S. Cl. ........................................ 333/175; 333/176
(58) Field of Search .............................. 333/175, 176, 333/184, 185, 174; 330/286, 302, 306

(56) References Cited

U.S. PATENT DOCUMENTS

| | | | | |
|---|---|---|---|---|
| 3,461,372 A | * | 8/1969 | Pickup et al. ................ 333/175 |
| 5,072,200 A | * | 12/1991 | Ranky ......................... 333/175 |
| 5,095,285 A | * | 3/1992 | Khatibzadeh ................ 330/306 |
| 5,202,651 A | * | 4/1993 | Yoshimasu ................... 333/170 |
| 5,880,649 A | * | 3/1999 | Tai et al. ..................... 333/132 |
| 5,939,939 A | * | 8/1999 | Gaynor et al. .......... 330/124 R |
| 5,969,582 A | * | 10/1999 | Boesch et al. ............... 333/129 |
| 6,100,776 A | * | 8/2000 | Furutani et al. ............. 333/134 |
| 6,104,259 A | * | 8/2000 | Miyaura ...................... 330/286 |

FOREIGN PATENT DOCUMENTS

JP  0213009 A  *  9/1991
JP  0114505 A  *  4/1992

* cited by examiner

*Primary Examiner*—Seungsook Ham
(74) *Attorney, Agent, or Firm*—Thelen Reid & Priest LLP

(57) ABSTRACT

An apparatus and method are provided for attenuating an undesired frequency ($f_1$) relative to a desired frequency ($f_o$) in a signal transmitted from an out-put (220) of an active element (210). Generally, the apparatus includes a parallel-resonant trap (145) coupled to the output of the active element (210), the trap including a network of reactive elements (235).

2 Claims, 5 Drawing Sheets

NOTCH FILTER AND METHOD

BACKGROUND OF THE INVENTION

1. Field of the Invention

The present invention relates generally to amplifier circuits, and more particularly to an apparatus and method for attenuating an undesired frequency in a signal output from an RF amplifier circuit in a wireless communications system, for example.

2. State of the Art

Wireless communications systems may typically include a chain of amplifier circuits in stages, each stage comprising an amplifier an filter circuit through which a received or modulated signal is passed in series. At each stage the filter circuit filters out unwanted (out of band) frequencies while the amplifiers amplify the remaining signals. Typically, each stage in the chain of amplifier circuits is a Radio Frequency ("RF") amplifier circuit.

RF amplifier circuits are well known and widely used in, for example, receivers, transmitters and transceivers including devices such as cellular telephone handsets, base stations, pagers and wireless modems.

An example of an RF amplifier circuit suitable for use in a cellular telephone handset is shown in FIG. 1. Referring to FIG. 1, a conventional RF amplifier circuit 10 typically includes an amplifier 12 having at least one active element or device 14 for amplifying a desired frequency or frequencies in a signal received on an input 16 thereto, and a network 18 performing the dual role of impedance transformation and suppressing or attenuating an undesired frequency or frequencies in the signal from an output 20 thereof. In the example shown in FIG. 1, the filter 18 is a particular type of low-pass filter (LPF), known as a three-section LPF, having a shunt capacitor 22, a series inductor 26 and another shunt capacitor 24, connected in that order. Values of the capacitors 22, 24, and the inductor 26 are selected to pass substantially unimpeded all frequencies below a predetermined first frequency ($f_0$) while attenuating all frequencies above $f_0$. For simplicity the amplifier circuit 10 is shown as including a single amplifier 12 with a single active element 14 and a single filter 18, however it will be appreciated that the amplifier circuit can include additional active elements and filters.

A graph of the output versus frequency of the amplifier circuit 10 of FIG. 1 is illustrated in FIG. 2. FIG. 2 is a graph of the gain, that is the change in strength of the signal between the input 18 and the output 20, versus frequency. As shown by line 28 in FIG. 2, the amplifier 12 is biased and the filter designed such that all frequencies below $f_0$ have a generally constant gain and are passed through the filter 18 substantially unimpeded, while all frequencies greater than $f_0$ are attenuated by an amount or factor that increases in proportion to the frequency. Generally, it is desirable to suppress the undesired frequencies above $f_0$ to avoid distortion of the desired output waveform.

A particular problem with convention amplifier circuits is the suppression of harmonics of the desired frequency, and more particularly the suppression of a second harmonic of a desired or fundamental frequency. Because of the proximity of the second harmonic, $2f_0$, to the fundamental frequency, $f_0$, conventional amplifier circuits using simply a low-pass filter have generally been unable to sufficiently suppress the second harmonic to avoid signal distortion. For example, as shown in FIG. 2, for an amplifier circuit using a conventional LPF 18 as shown in FIG. 1, the signal out will include in addition to the fundamental frequency a second harmonic that is attenuated by a factor of less than about 30 dB relative to the fundamental.

Several approaches have attempted to provide an amplifier circuit having a filter or apparatus for sufficiently suppressing the second harmonic while pass the fundamental frequency substantially unattenuated. One approach, also shown in FIG. 1, is the addition of a series-resonant trap 30 in shunt with the output 20 of the amplifier circuit 10. The series-resonant trap 30 is designed to have a low impedance to any frequencies occurring at the second harmonic, thereby shunting a portion of this component of the signal to ground. The result, as shown by line 32 in FIG. 2, is a dip, or notch, in the output from the amplifier circuit 10 at the second harmonic. However, while this approach is effective to a degree, it is not wholly satisfactory. For example, to generate 1 W of power from a 3 V battery requires the active device to have load impedance below 4 ohms. For the shunt trap to successfully remove signals at the second harmonic, its impedance must be significantly lower, such as 0.5 ohms. Such low impedances are difficult to attain.

Another problem with the use of the series-resonant trap of FIG. 1 is the impact of the trap on other characteristics of the circuit.

BRIEF DESCRIPTION OF THE DRAWING

The present invention may be further understood from the following description in conjunction with the appended drawing. In the drawing.

DETAILED DESCRIPTION OF THE PREFERRED EMBODIMENTS

The present invention is directed to an apparatus and method capable of attenuating an undesired frequency in a signal output from an amplifier, especially, for example, in a portable telephone handset or base station such as in a wireless communications system, while minimizing or eliminating any effect on the main signal.

Figure 1:
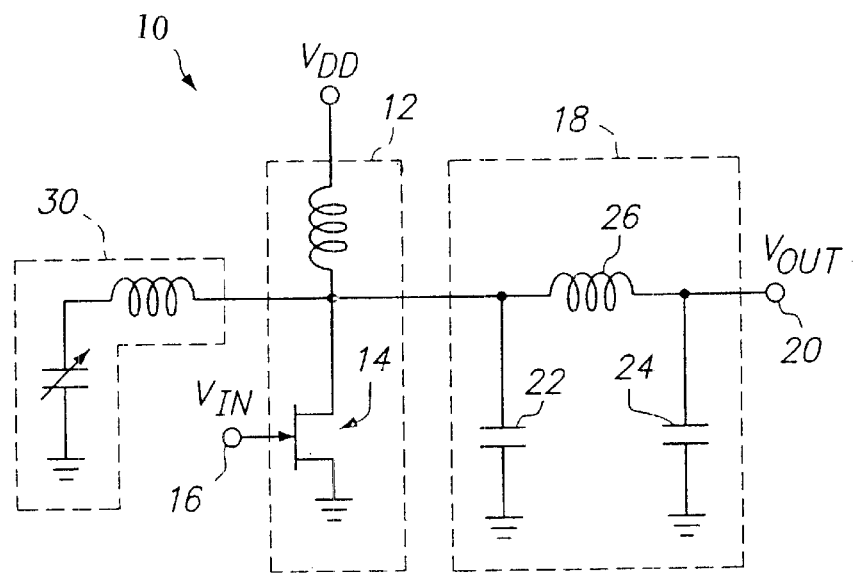
FIG. 1 is a schematic diagram of a conventional amplifier circuit.
Figure 2:
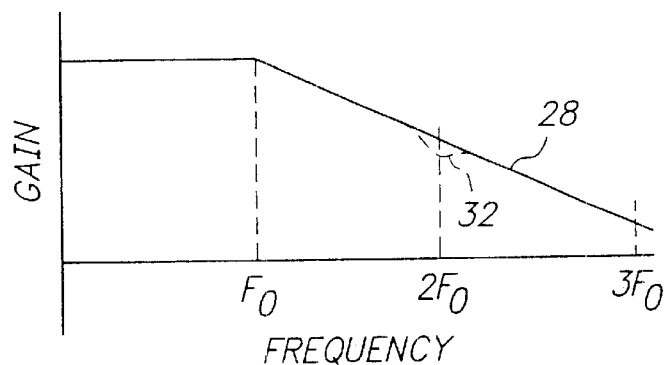
FIG. 2 is a graph of the gain characteristics of the amplifier circuit of FIG. 1.
Figure 3:
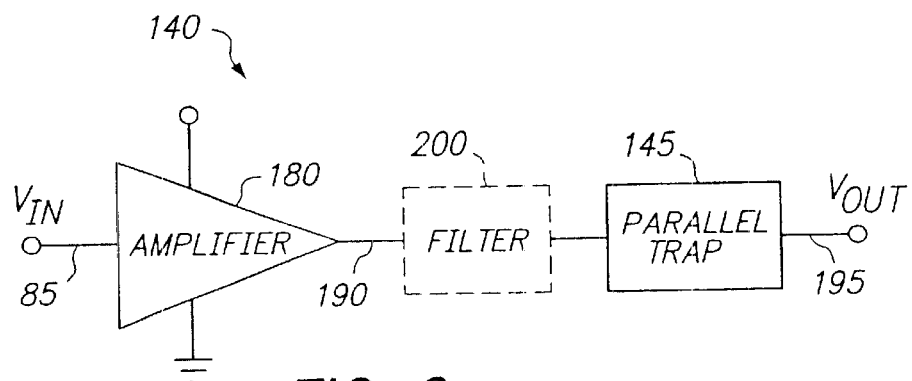
FIG. 3 is a block diagram of an amplifier circuit in accordance with the invention.

An embodiment of an amplifier circuit 140 for use in, for example, an RF transmitter will now be described with reference to FIG. 3. Generally, the amplifier circuit 140 includes a high frequency power amplifier 180 having an input 185 for receiving a signal thereon and an amplifier output 190 for coupling the amplifier signal to a parallel-resonant trap 145. A circuit output 195 couples the signal from the parallel-resonant trap 145 to subsequent stages or devices such as an antenna or additional amplifying or filtering circuits. Optionally, as shown in FIG. 3, the amplifier circuit 140 may include additional filtering elements such as a filter 200. The filter 200 may include elements configured to form a low-pass, high-pass or band-pass filter.

Figure 4:
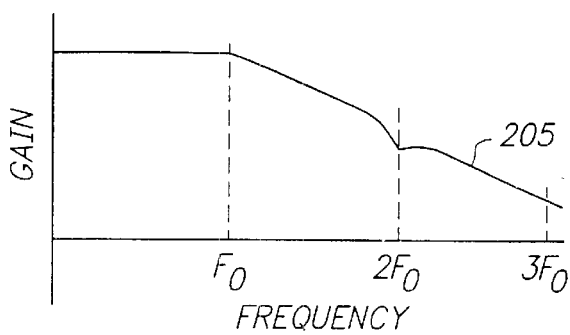
FIG. 4 is a graph of the gain characteristics of the amplifier circuit of FIG. 3.

A graph of the gain versus frequency of the output 195 of the amplifier circuit 140 of FIG. 3 is illustrated in FIG. 4. As shown by line 205 in FIG. 4, the amplifier 140 is designed and biased such that all frequencies below the desired frequency ($f_0$) have a generally constant gain. The filter 200 may be a single or multiple pole low-pass filter configured such that all frequencies above the desired frequency ($f_0$) are attenuated by an amount or factor that increases in proportion to the frequency. In accordance with the present invention, the parallel-resonant trap 145 is tuned to further attenuate or suppress an undesired frequency. In the embodiment shown, the undesired frequency is a second harmonic of the fundamental desired frequency, and the parallel-resonant trap 145 is tuned to attenuate this frequency while leaving the desired frequency substantially unchanged.

Figure 5:
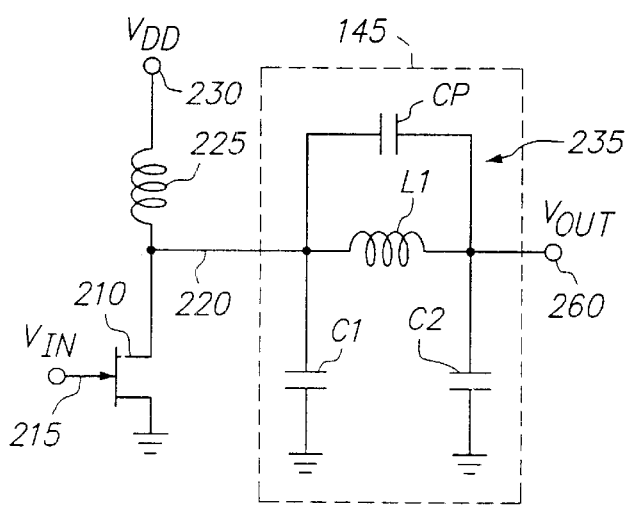
FIG. 5 is a more detailed diagram of one embodiment of the amplifier circuit of FIG. 3.

A schematic diagram of an amplifier circuit 140 having a parallel-resonant trap 145 according to the present invention will now be described with reference to FIG. 5. Generally, the amplifier circuit 140 includes an amplifying or active element 210, such as a bipolar or field effect transistor, In one embodiment shown in FIG. 5, the parallel-resonant trap 145 is a network of reactive elements 235 including capacitive and inductive elements having fixed or variable reactance. Each of the active elements may include one or more discrete components or can be distributed capacitance or inductance due to other circuit elements such as wires, vias, bonding pads and the like. In one version of this embodiment, the network of reactive elements 235 functions as both a low-pass filter and a parallel-resonant trap by proper selection of values of inductance (L) and capacitance (C) for L1, CP, C1 and C2, respectively. Specific values of inductance and capacitance for these elements will depend on the application in which the amplifier circuit is to be used, further in view of the desired frequency and the undesired frequency to be suppressed.

It is to be noted that any of the capacitive and inductive elements in the above embodiments may include a variable reactance element, such as a variable inductor or a variable capacitor. The ability to adjust reactance of one or more elements enables the parallel-resonant trap 145 to be tuned to closely match the undesired frequency and to compensate for parasitic capacitances and inductances that arise from other elements in the amplifier circuit 140.

An advantageous design procedure allows the network of reactive elements 235 to be readily designed based on well-understood filter design techniques. Using this procedure, first, a filter is designed without regard to a desired notch characteristic. Then, one or more additional reactive elements are added to provide a notch in the filter response, and the values of existing reactive elements are adjusted by formula to preserve substantially unchanged the corner frequency and other characteristics of the original filter. The design procedure is general and may be applied to low-pass, high-pass, or band-pass filters.

The approach may be summarized in accordance with the following table:

| Initial element | Impedance at $f_1$ | Added Element | New base element | Added element | Frequency restriction |
|---|---|---|---|---|---|
| Inductor $L_1$ | $X_{L_1} = \omega_1 L_1$ | Series Cs | $L_2 = \dfrac{L_1}{1 - \left(\dfrac{f_2}{f_1}\right)^2}$ | $Cs = \dfrac{1 - \left(\dfrac{f_2}{f_1}\right)^2}{\omega_2^2 L_1}$ | $f_2 < f_1$ |
| | | Shunt Cp | $L_2 = L_1\left(1 - \left(\dfrac{f_1}{f_2}\right)^2\right)$ | $Cp = \dfrac{1}{\omega_2^2 L_1 \left(1 - \left(\dfrac{f_1}{f_2}\right)^2\right)}$ | $f_2 > f_1$ |
| Capacitor $C_1$ | $X_{C_1} = \dfrac{1}{\omega_1 C_1}$ | Series Ls | $C_2 = C_1\left(1 - \left(\dfrac{f_1}{f_2}\right)^2\right)$ | $Ls = \dfrac{1}{\omega_2^2 C_1\left(1 - \left(\dfrac{f_1}{f_2}\right)^2\right)}$ | $f_2 > f_1$ |
| | | Shunt Lp | $C_2 = \dfrac{C_1}{1 - \left(\dfrac{f_2}{f_1}\right)^2}$ | $Lp = \dfrac{1 - \left(\dfrac{f_2}{f_1}\right)^2}{\omega_2^2 C_1}$ | $f_2 < f_1$ | having an amplifier input 215 and an output 220 coupled through an inductor 225 to a voltage source 230, shown here as $V_{DD}$, and to the parallel-resonant trap 145. While shown here as a single active element 210, it will be appreciated that the amplifying element can include any number of active elements, formed either as discrete devices or as an integrated circuit (IC), and cascaded to further increase gain.

Figure 6:
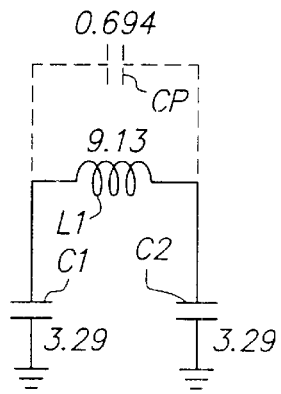
FIG. 6 is a circuit diagram of a low-pass filter prior to modification.

Use of the table may best be illustrated by way of example. Take first the example of a low-pass filter as illustrated in FIG. 6, where the values indicated are expressed in picofarads and nanohenries, respectively. In general, a low-pass filter has shunt capacitors and series inductors. Although a three-section filter is shown, the filter may have any desired number of sections. The response of the low-pass filter of FIG. 6 has a corner frequency of $f_1=1$ GHz as shown in FIG. 8.

Figure 7:
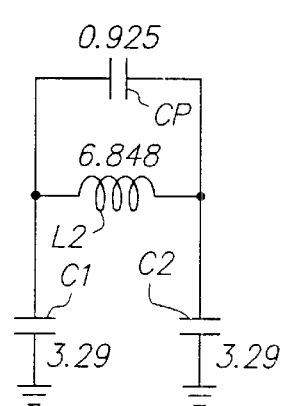
FIG. 7 is a circuit diagram of a low-pass filter obtained by modifying the low-pass filter of FIG. 6.
Figure 11:
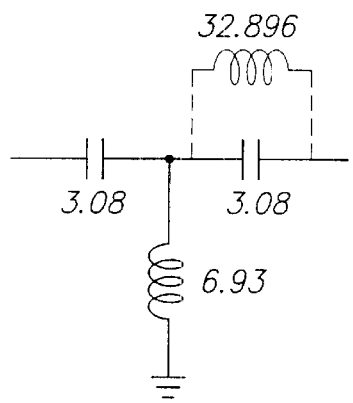
FIG. 11 is a circuit diagram of a high-pass filter prior to modification.
Figure 12:
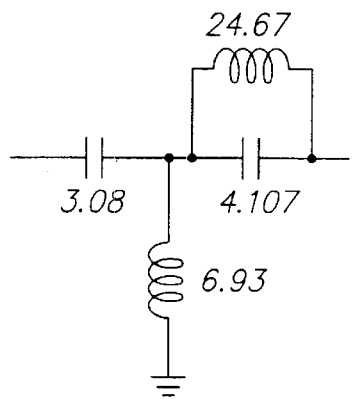
FIG. 12 is a circuit diagram of a high-pass filter obtained by modifying the low-pass filter of FIG. 11.
Figure 8:
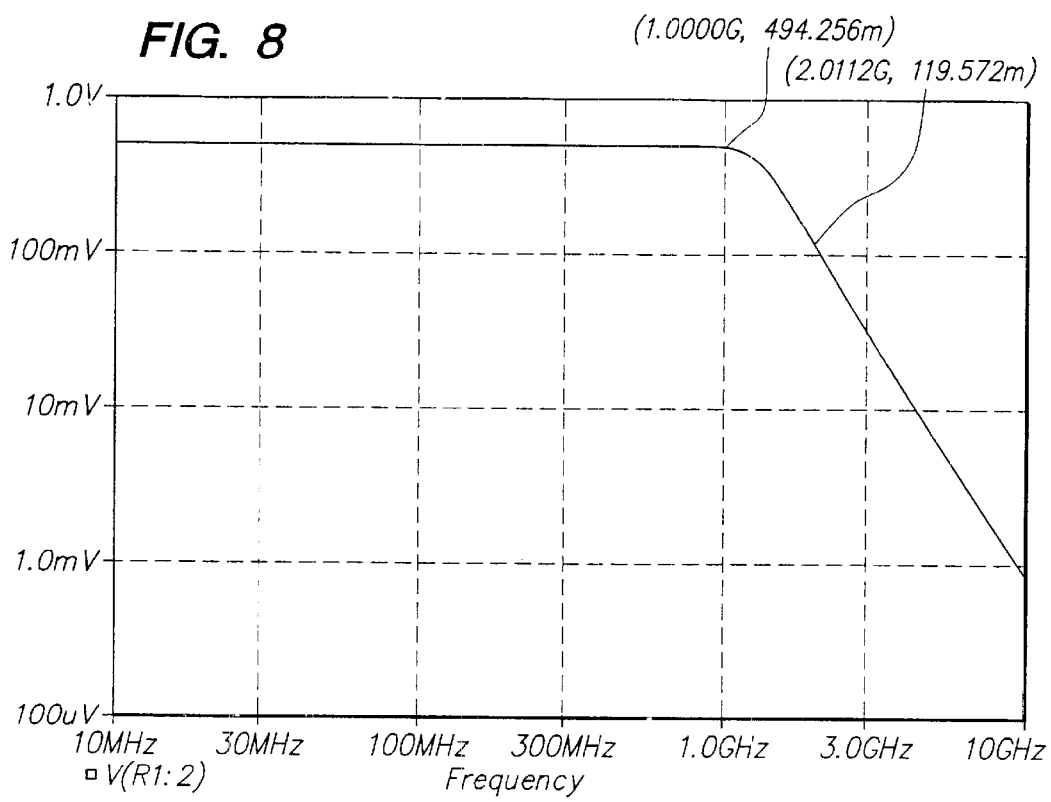
FIG. 8 is a plot of the response of the filter of FIG. 6.
Figure 9:
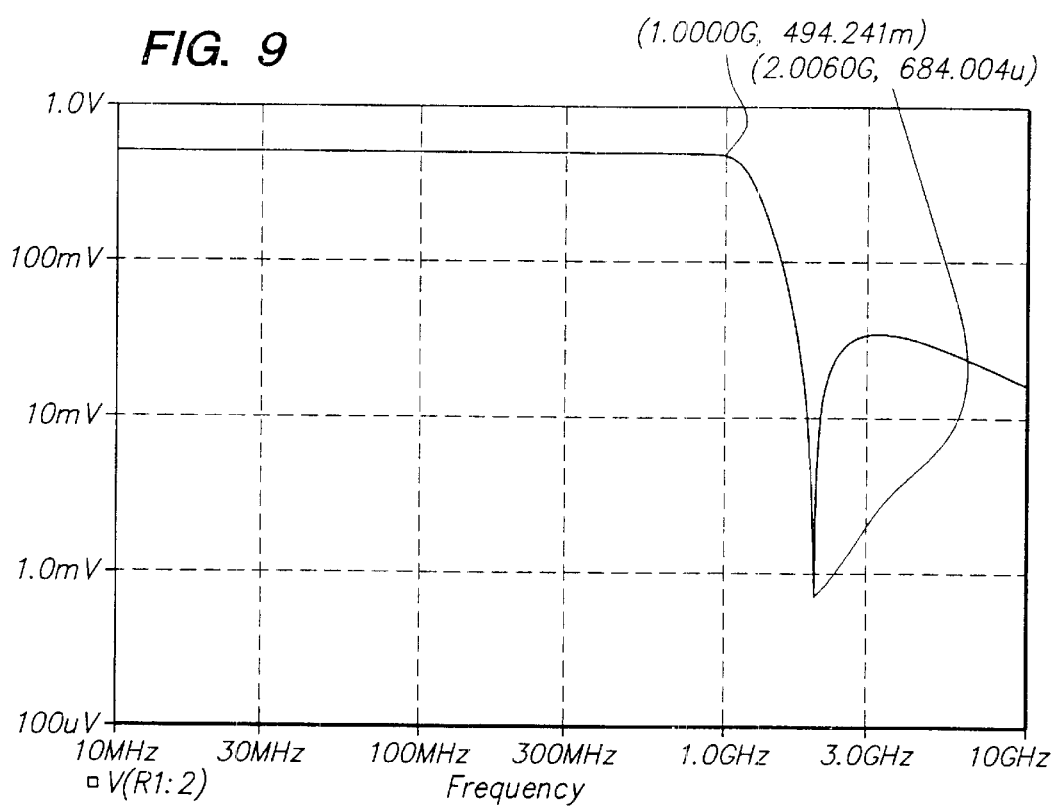
FIG. 9 is a plot of the response of the filter of FIG. 7.
Figure 10:
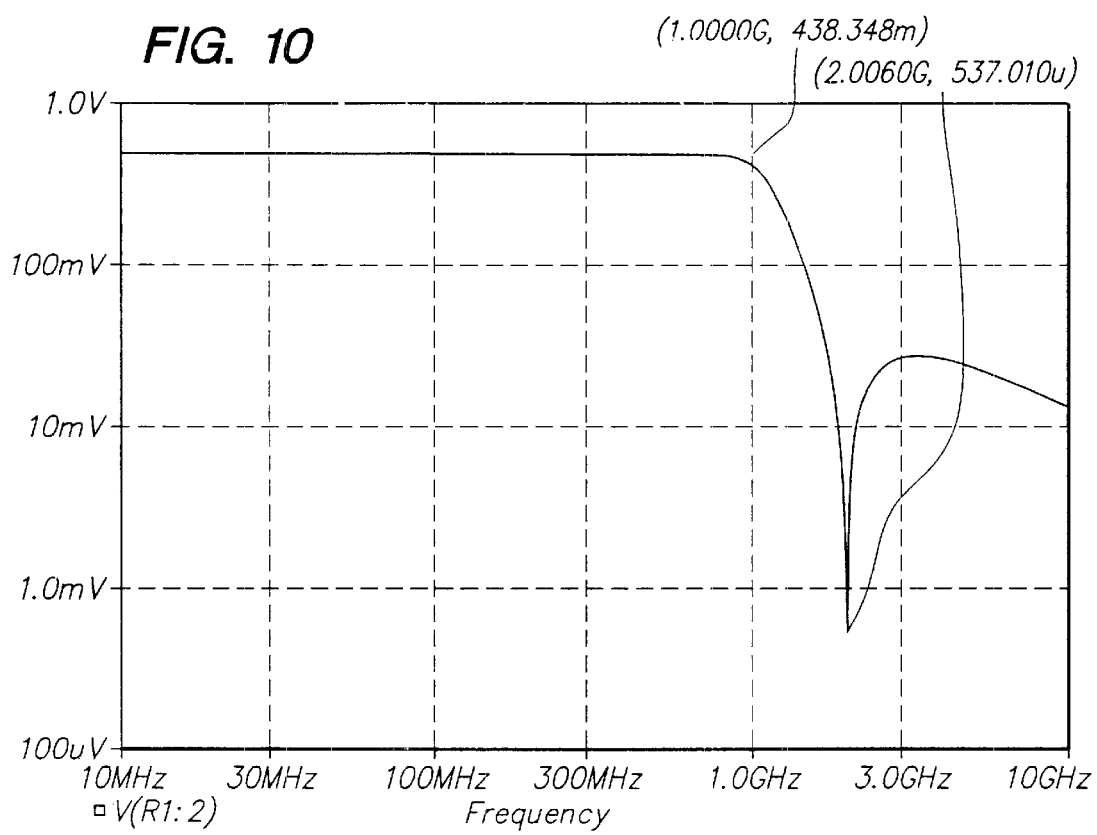
FIG. 10 is a plot of the response of a similar filter circuit designed without the benefit of the methodology presented.
Figure 13:
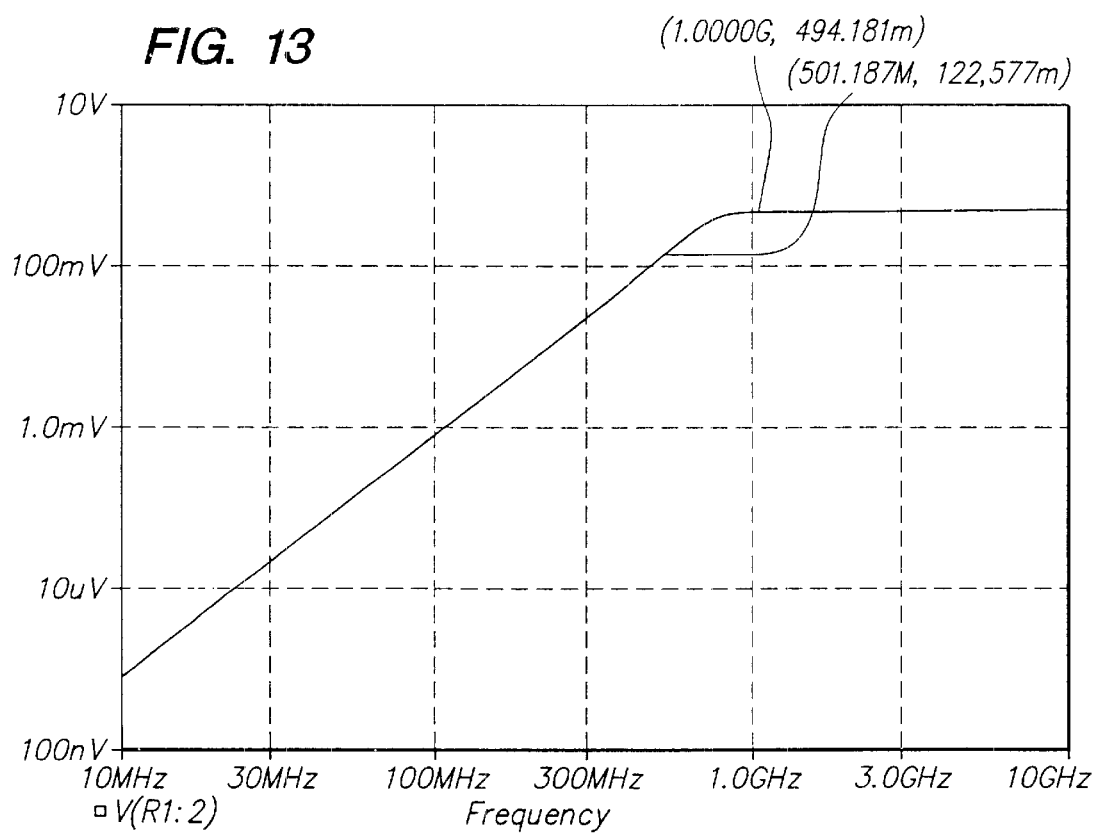
FIG. 13 is a plot of the response of the filter of FIG. 11.
Figure 14:
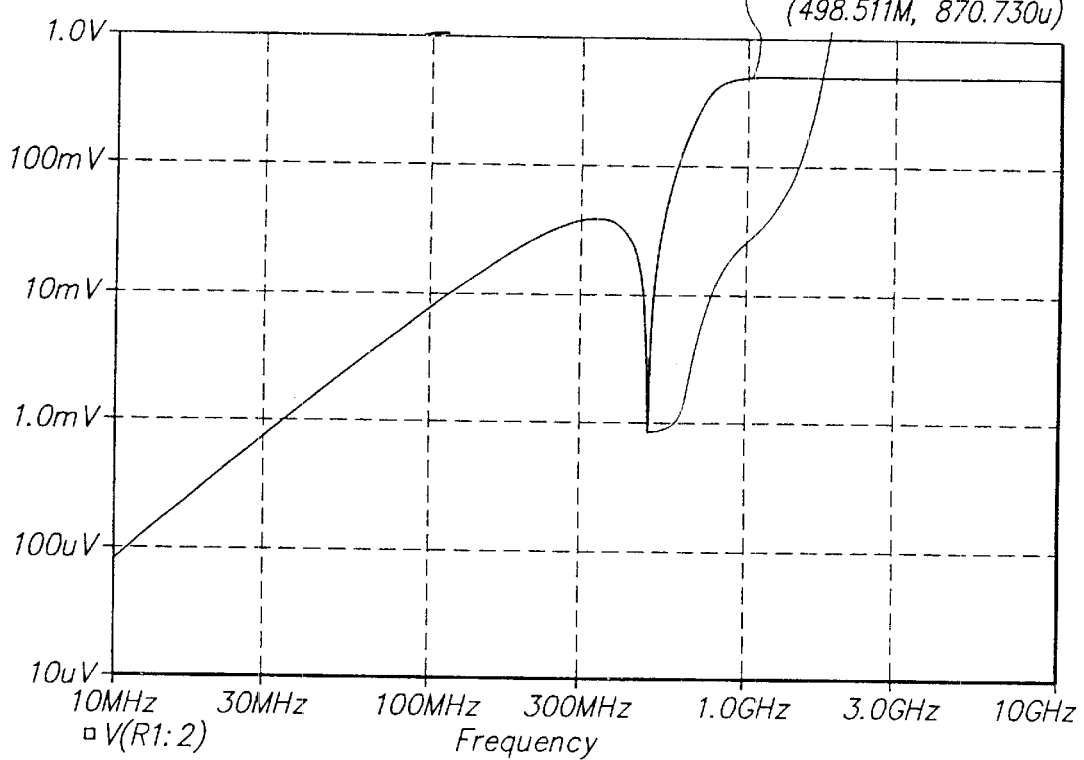
FIG. 14 is a plot of the response of the filter of FIG. 12.
Figure 15:
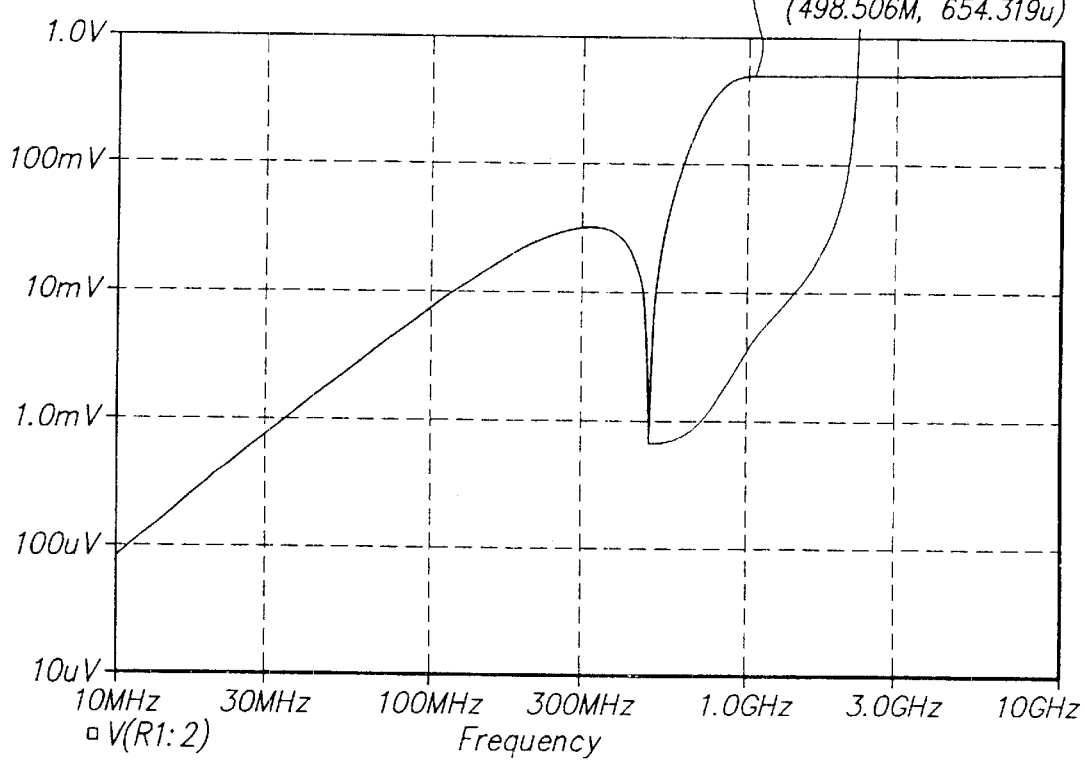
FIG. 15 is a plot of the response of a similar filter circuit designed without the benefit of the methodology presented.

Assume now that a notch is to be added to the filter response of FIG. 8 at a frequency $f_2>f_1$. Such a notch characteristic may be achieved by adding a capacitor $C_P$ in parallel with the inductor $L_1$ of FIG. 6 to arrive at the circuit of FIG. 7. The values of the capacitor $C_P$ and the new inductor $L_2$ may be determined from the foregoing table. Since a shunt capacitor is being added to an inductor (the initial element), the second row of the table applies and may be used to calculate the values of $C_P$ and $L_2$, which are indicated in FIG. 7. As seen in FIG. 9, using the values from the table, the desired notch characteristic is achieved with negligible effect on the original corner frequency $f_1$. If instead the value of the initial element were kept unchanged and the new element added having a value calculated to achieved the desired notch characteristic, a loss of about −1 dB would be experienced at the original corner frequency, as illustrated in FIG. 10.

Instead of adding a shunt capacitor $C_P$ to the inductor $L_1$ of FIG. 6, a series inductor $L_S$ could be added to one or both of the capacitors $C_1$ and $C_2$. Row 3 of the table would be used for this purpose.

FIG. 11 through FIG. 15 illustrate in similar fashion modification of a high-pass filter to add a notch to the filter response. Typically, the form of a high-pass filter is the dual of that of a low-pass filter—that is, inductors and capacitors are interchanged such that, in the high-pass case, capacitors are connected in series and inductors are connected in shunt. A notch is created in this instance by adding a shunt inductor $L_P$ to the capacitor $C_2$, using row 4 of the table. Instead of adding a shunt inductor $L_P$ to the capacitor $C_2$ of FIG. 11, a series capacitor $C_S$ could be added to the inductor $L_1$. Row 1 of the table would be used for this purpose.

It will be appreciated by those of ordinary skill in the art that the invention can be embodied in other specific forms without departing from the spirit or essential character thereof. The presently disclosed embodiments are therefore considered in all respects to be illustrative and not restrictive. The scope of the invention is indicated by the appended claims rather than the foregoing description, and all changes which come within the meaning and range of equivalents thereof are intended to be embraced therein.

What is claimed is:

1. A method of modifying a filter design including a reactive element of a first type and having a given filter response having a given corner frequency to add to a response of the filter a notch characteristic occurring at a desired notch frequency, comprising:

adding a reactive element of a second type to the reactive element of the first type to form one of a series-resonant combination and a parallel-resonant combination;

determining by formula a value of the reactive element of the second type as a function of the value of the reactive element of the first type, the corner frequency, and the notch frequency; and determining by formula a new value of the reactive element of the first type as a function of an old value of the reactive element of the first type, the corner frequency, and the notch frequency.

2. The method of claim 1, wherein a desired notch characteristic is achieved with negligible effect on the original corner frequency.

* * * * *